United States Patent
Ishida

(10) Patent No.: US 10,967,744 B2
(45) Date of Patent: Apr. 6, 2021

(54) ELECTRICALLY OPERATED WORKING VEHICLE

(71) Applicant: HITACHI CONSTRUCTION MACHINERY CO., LTD., Tokyo (JP)

(72) Inventor: Toshihiko Ishida, Hitachi (JP)

(73) Assignee: HITACHI CONSTRUCTION MACHINERY CO., LTD., Tokyo (JP)

( * ) Notice: Subject to any disclaimer, the term of this patent is extended or adjusted under 35 U.S.C. 154(b) by 33 days.

(21) Appl. No.: 16/330,398

(22) PCT Filed: Nov. 23, 2017

(86) PCT No.: PCT/JP2017/042119
§ 371 (c)(1),
(2) Date: Mar. 5, 2019

(87) PCT Pub. No.: WO2018/163524
PCT Pub. Date: Sep. 13, 2018

(65) Prior Publication Data
US 2020/0223313 A1 Jul. 16, 2020

(30) Foreign Application Priority Data
Mar. 10, 2017 (JP) .............................. JP2017-045918

(51) Int. Cl.
*B60L 50/15* (2019.01)
*G01R 31/52* (2020.01)
(Continued)

(52) U.S. Cl.
CPC .............. *B60L 50/15* (2019.02); *B60L 3/003* (2013.01); *G01R 31/52* (2020.01); *B60P 1/04* (2013.01)

(58) Field of Classification Search
CPC .......... B60L 3/003; B60L 50/15; G01R 31/52
See application file for complete search history.

(56) References Cited

U.S. PATENT DOCUMENTS

2003/0155928 A1* 8/2003 Roden ................... B60L 3/0069
324/509
2004/0130326 A1* 7/2004 Yamamoto ............ B60L 3/0069
324/503
(Continued)

FOREIGN PATENT DOCUMENTS

JP          6-225542 A      8/1994
JP       2004-168149 A      6/2004
(Continued)

OTHER PUBLICATIONS

Japanese Office Action received in corresponding Japanese Application No. 2017-045918 dated Aug. 6, 2019.
(Continued)

*Primary Examiner* — Dominic E Hawkins
(74) *Attorney, Agent, or Firm* — Mattingly & Malur, PC

(57) ABSTRACT

A dump truck is provided with a ground fault detection device that detects a ground fault detection voltage V0 as a difference between a detection voltage Vp between a positive electrode line of a DC bus and a neutral point N and a detection voltage Vn between the neutral point N and a negative electrode line of the DC bus and detects a ground fault based upon the ground fault detection voltage V0. The ground fault detection device includes a DC component determining section that extracts a DC component $V_{Ldc}$ from the ground fault detection voltage V0 and determines a ground fault based upon the DC component $V_{Ldc}$, and a drive frequency component determining sections (that extract drive frequency components $V_{LiR}$, $V_{LiL}$ of the inverters from the ground fault detection voltage V0 and determine a ground fault based upon the drive frequency components $V_{LiR}$, $V_{LiL}$.

6 Claims, 7 Drawing Sheets

(51) Int. Cl.
  *B60L 3/00* (2019.01)
  *B60P 1/04* (2006.01)

(56) References Cited

U.S. PATENT DOCUMENTS

| | | | |
|---|---|---|---|
| 2014/0008970 A1* | 1/2014 | Yamaguchi | B60L 3/04 |
| | | | 307/9.1 |
| 2015/0291088 A1* | 10/2015 | Ueno | G01R 31/52 |
| | | | 315/77 |
| 2017/0097384 A1 | 4/2017 | Yamada et al. | |
| 2017/0131340 A1 | 5/2017 | Tallam et al. | |
| 2017/0164519 A1* | 6/2017 | Uchida | H02M 1/00 |

FOREIGN PATENT DOCUMENTS

| | | |
|---|---|---|
| JP | 2004-260974 A | 9/2004 |
| JP | 2010-88289 A | 4/2010 |
| JP | 2012-157140 A | 8/2012 |
| JP | 2013-192429 A | 9/2013 |
| JP | 5535880 B2 | 7/2014 |
| JP | 2015-162998 A | 9/2015 |
| JP | 2015-180162 A | 10/2015 |
| KR | 10-2012-0108458 A | 10/2012 |

OTHER PUBLICATIONS

International Search Report of PCT/JP2017/042119 dated Feb. 13, 2018.
Japanese Office Action received in corresponding Japanese Application No. 2017-045918 dated Dec. 10, 2019.
Extended European Search Report received in corresponding European Application No. 17899530.4 dated Nov. 23, 2020.

* cited by examiner

ELECTRICALLY OPERATED WORKING VEHICLE

TECHNICAL FIELD

The present invention relates to an electrically operated working vehicle such as a dump truck provided with an inverter and an electric motor.

BACKGROUND ART

In general, there is known an electrically operated working vehicle in which an electric drive system is adopted in a drive system for travelling, such as a large-sized dump truck and the like. Such an electrically operated working vehicle is provided with a DC bus that is composed of a positive electrode and a negative electrode and to which a DC voltage is applied, an inverter connected to the DC bus, and an electric motor connected to the inverter (Patent Document 1).

On the other hand, when insulation resistance between an electrical circuit including an inverter and an electric motor and a ground potential degrades, a ground fault current flows. Therefore, there is known a ground fault detection device that is provided in such an electric circuit to detect a ground fault state (Patent Document 2).

PRIOR ART DOCUMENT

Patent Document

Patent Document 1: Japanese Patent Laid-Open No. 2010-88289 A

Patent Document 2: Japanese Patent No. 5535880

SUMMARY OF THE INVENTION

Incidentally, in the electrically operated working vehicle, the DC power applied to the DC bus is converted into AC power of a drive frequency for driving the electric motor by PWM control by the inverter. The control of a motor is generally performed separately with exciting current determining a magnetic flux in the inside of the motor and torque current determining output torque of the motor by acting on the magnetic flux. Here, since control responsiveness of the exciting current controlling the magnetic flux in the inside of the motor is low, it is general to control the exciting current to be a constant value and control the torque current high in responsiveness. In the motor drive of a variable frequency under a constant magnetic flux in the inside of the motor, since an inductive voltage generating in the inside of the motor is low when a motor rotational speed is low, an AC output voltage for controlling the inverter is low following this. Since the inductive voltage generating in the inside of the motor is high when the motor rotational speed is high, the AC output voltage for controlling the inverter requires a high voltage following this.

However, the AC voltage that the inverter can output to a DC bus voltage has an upper limit. Therefore, when the motor rotational speed is high and the AC output voltage of the inverter reaches the upper limit, it is not possible to perform the motor control in a state where the exciting current is made constant, by the inverter in the speed faster than that. In this case, by lowering the exciting current of the motor and lowering the magnetic flux in the inside of the motor, the control called "field weakening" of lowering the exciting voltage that will generate in the inside of the motor even in the same rotational speed is generally performed. In the control of this "field weakening", the motor is controlled until a higher rotational speed region by lowering an inverter AC output voltage required for the motor control. Even when the motor rotational speed increases in the "field weakening" control region, the AC output voltage of the inverter does not increase in proportion thereto, and is almost controlled to an upper limit voltage that can be outputted by the inverter. Therefore, the output power to be taken out of the motor cannot increase even when the rotational speed is increased. Accordingly, for taking more output from the motor, means for increasing the upper limit of the AC voltage that can be output with respect to the DC bus voltage are performed in the inverter drive of the motor.

One of the means is "third harmonic superposition" of adding a harmonic component of the integral multiple of 3 to a modulating wave of the PWM control. By superposing the third harmonic to a fundamental wave component of a drive frequency to each phase of the inverter, even in the same DC bus voltage, it is possible to increase the AC output voltage by approximately one out of ten, for example, as compared to a case of not performing "third harmonic superposition". In this case, in a line-to-line voltage of a three-phase motor, third harmonic superpositions superposed in the respective phases are cancelled out and only the fundamental wave component appears. However, a component acquired by performing addition-averaging of the third harmonics of the respective phases appears between a neutral point of the inverter and an average voltage of the entire three-phase motor.

In some cases, over modulation control of the PWM control is performed as another method of increasing the upper limit of the AC voltage. In a usual PWM control, the harmonic component contained in the AC output of the inverter is suppressed to be low by reducing an amplitude of the modulating wave of the PWM to be less than the amplitude of a carrier for making the output voltage of the inverter a sine wave. However, in this case, the amplitude of the fundamental wave component appearing in the AC output of the inverter becomes smaller by a low amount of the modulating wave. On the other hand, when the amplitude of the modulating wave of the PWM is made to be more than the amplitude of the carrier (made to be overmodulated), it is possible to make the amplitude of the fundamental wave component contained in the AC output of the inverter large. In this case, in a time region where the amplitude of the modulating wave is larger than the amplitude of the carrier, the switching of the PWM is not performed, and many low-order harmonic components such as third harmonics are contained in the inverter AC output.

For taking out more output from the motor in this way, when the upper limit of the AC voltage that can be outputted with respect to the DC bus voltage is made to be higher, third harmonic voltage components will be contained in the AC output voltage of the inverter. The third harmonic components cannot be cancelled out even those of three phases are added for combination. Therefore, an average voltage of the entire motor to which the third harmonic components are applied varies to the neutral point of the inverter with the third harmonic component.

On the other hand, a ground fault detection device described in Patent Document 2 is connected to an electrical circuit of an electric motor driven by a commercial power source, and can detect a ground fault current in both a commercial frequency and an output frequency of an inverter. However, the ground fault detection device described in Patent Document 2 detects a ground fault state using all signals of the frequency higher than the commercial frequency, not limited to the output frequency of the inverter. Therefore, when the ground fault detection device described in Patent Document 2 is applied to the electric circuit in the electrically operated working vehicle, there occurs a problem that the ground fault state is erroneously detected by an increasing third harmonic.

Particularly, in a large-sized electrically operated working vehicle, a DC high voltage equal to or more than 1000V is applied to the DC bus. At this time, when the carrier frequency of the PWM control is set to high, a power loss due to the switching operation of the inverter increases. Therefore, there is a tendency that the carrier frequency of the PWM control is set to low, and the drive frequency and the carrier frequency of the inverter tend to be easily close to each other. As a result, there is a tendency that the erroneous detection of the ground fault state by the third harmonic is remarkable.

The present invention is made in view of the aforementioned problems in the conventional technology, and an object of the present invention is to provide an electrically operated working vehicle that can detect a ground fault state in both DC and AC side of the drive system while preventing the erroneous detection.

For solving the above-mentioned problems, the present invention is applied to a DC bus that is composed of a positive electrode and a negative electrode and to which a DC voltage is applied; an inverter that is connected to the DC bus; and an electric motor that is connected to the inverter, comprising: a voltage divider that is connected to the positive electrode and the negative electrode of the DC bus and divides a voltage applied to the DC bus to form a neutral point; and a ground fault detection device that detects a ground fault detection voltage as a difference between a voltage between the positive electrode of the DC bus and the neutral point and a voltage between the neutral point and the negative electrode of the DC bus and detects a ground fault based upon the ground fault detection voltage, characterized in that: the ground fault detection device includes: a DC component determining section that extracts a DC component from the ground fault detection voltage and determines a ground fault based upon the DC component; and a drive frequency component determining section that extracts a drive frequency component of the inverter from the ground fault detection voltage and determines a ground fault based upon the drive frequency component.

According to the present invention, it is possible to detect the ground fault state in both DC and AC side circuit of the drive system while preventing the erroneous detection.

MODE FOR CARRYING OUT THE INVENTION

Hereinafter, an explanation will be in detail made of an electrically operated working vehicle according to an embodiment of the present invention with reference to the accompanying drawings, by taking a dump truck as an example thereof.

Figure 1:
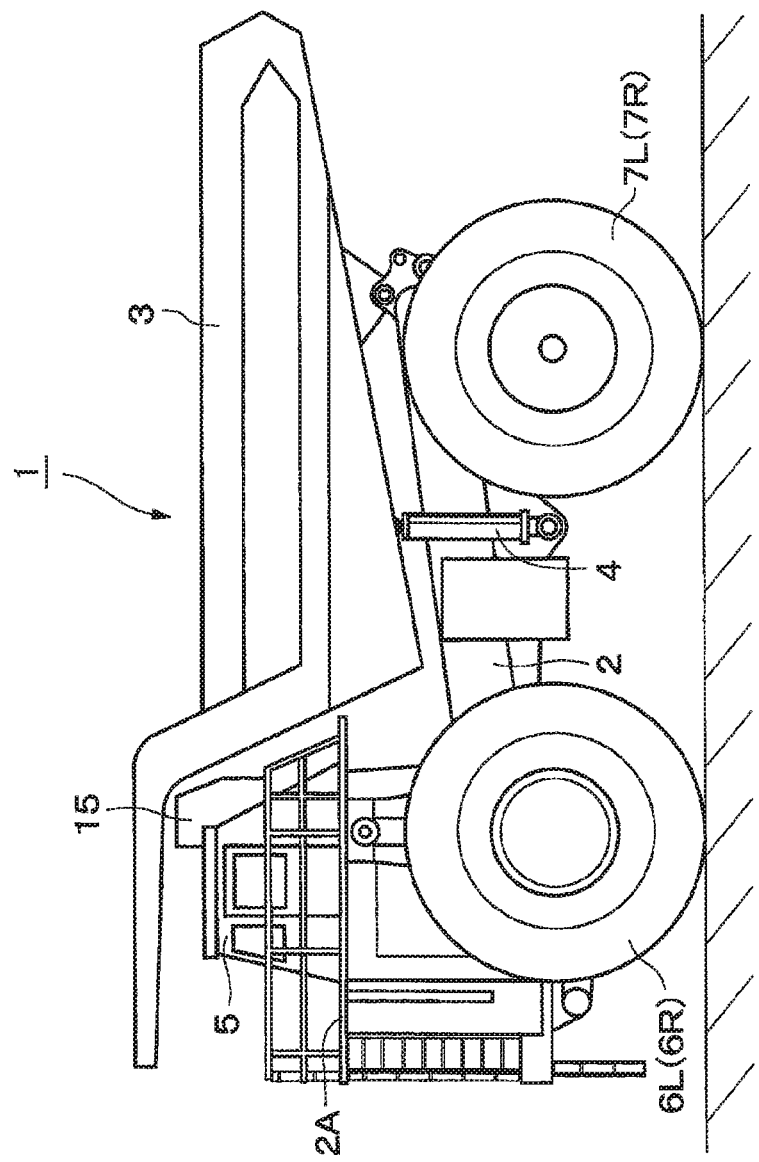
FIG. 1 is a side view showing a dump truck according to an embodiment of the present invention as viewed from the left side.
Figure 2:
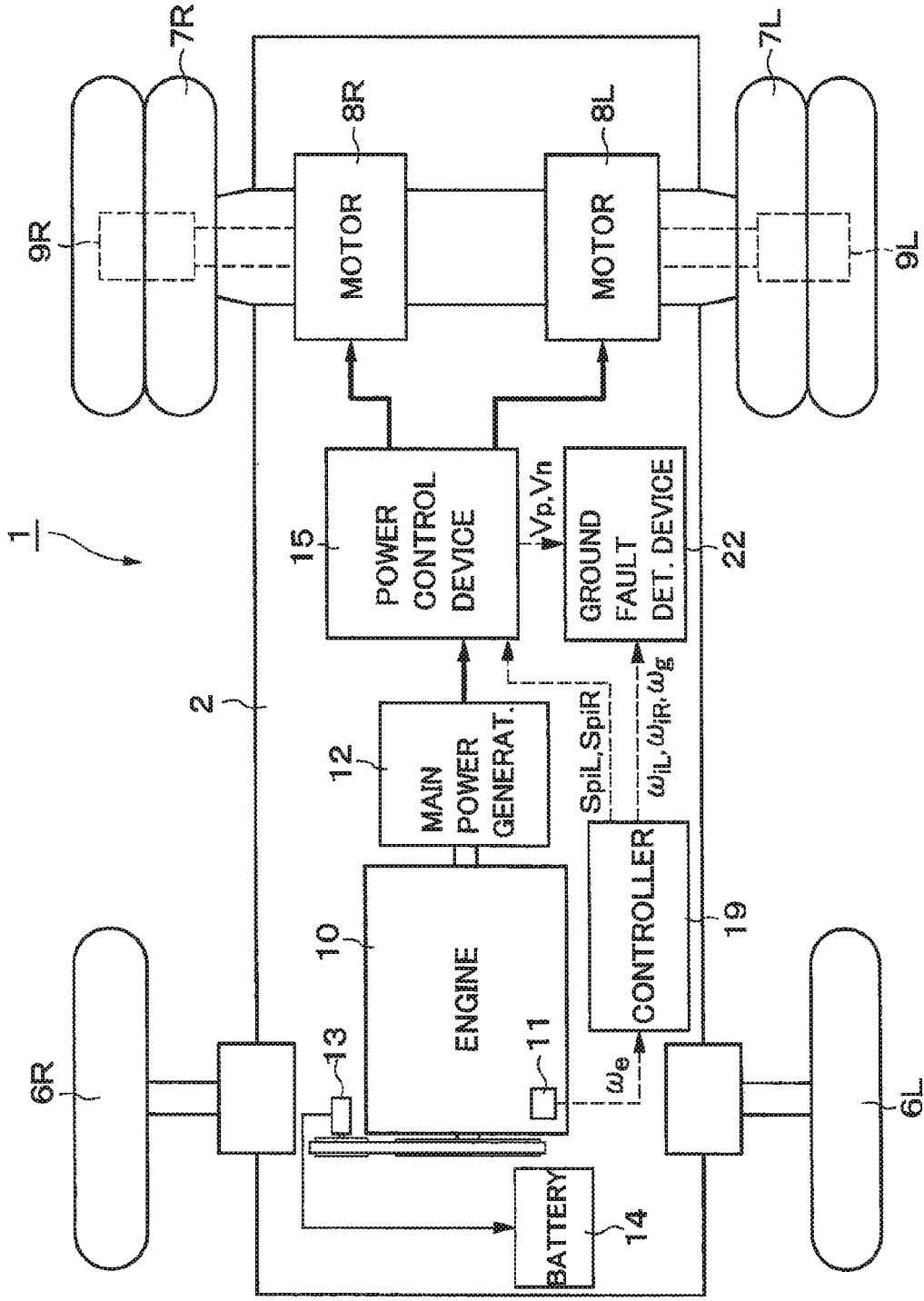
FIG. 2 is an entire configuration diagram showing the dump truck in FIG. 1.

Here, FIG. 1 to FIG. 4 show an embodiment of the present invention. AS shown in FIG. 1 and FIG. 2, a dump truck 1 is largely configured of a vehicle body 2 formed in a frame structure, and a vessel 3 as a loading platform that is mounted on the vehicle body 2 to be capable of rising and falling thereon. The vehicle body 2 self-travels by front wheels 6R, 6L and rear wheels 7R, 7L as wheels. The vessel 3 rises and falls (tilts) by hoist cylinders 4 arranged in both of the left and right sides of the vehicle body 2.

A cabin 5 is disposed on a deck part 2A that is positioned in a front part left side of the vehicle body 2, for example, and is formed as a flat floor plate. The cabin 5 forms an operator's room which an operator of the dump truck 1 gets in and gets out of. An operator's seat, an activation switch, an accelerator pedal, a brake pedal, a handle for steering, and a plurality of operating levers (none of them is shown) are provided in the inside of the cabin 5.

The front wheels 6R, 6L configure steering wheels that are steered by an operator of the dump truck 1. The front wheel 6R is positioned under the front side of the vehicle body 2 and is provided to be rotatable in the right side of the vehicle body 2. The front wheel 6L is positioned under the front side of the vehicle body 2 and is provided to be rotatable in the left side of the vehicle body 2.

The rear wheels 7R, 7L configure driving wheels of the dump truck 1. The rear wheel 7R is positioned under the rear part of the vehicle body 2 and is provided to be rotatable in the right side of the vehicle body 2. The rear wheel 7L is positioned under the rear part of the vehicle body 2 and is provided to be rotatable in the left side of the vehicle body 2.

Traveling motors 8R, 8L each are configured by a large-sized electric motor such as a three-phase induction electric motor or a three-phase brushless DC electric motor. The traveling motors 8R, 8L are respectively connected to inverters 17R, 17L. The traveling motors 8R, 8L are driven and rotated by power supply from a power control device 15. The traveling motor 8R is positioned under the rear part of the vehicle body 2 and is provided in the right side of the vehicle body 2. The traveling motor 8L is positioned under the rear part of the vehicle body 2 and is provided in the left side of the vehicle body 2.

As shown in FIG. 2, the traveling motors 8R, 8L drive and rotate the left rear wheel 7L and the right rear wheel 7R independently from each other. The right traveling motor 8R is connected to the rear wheel 7R through a multi-stage planetary gear reduction mechanism 9R. The left traveling motor 8L is connected to the rear wheel 7L through a multi-stage planetary gear reduction mechanism 9L. Consequently, the rotation of each of the traveling motors 8R, 8L is decelerated, for example, in a reduction ratio of approximately 30 to 40, for example, by each of the planetary gear reduction mechanisms 9R, 9L, which will be transmitted to each of the rear wheels 7R, 7L.

An engine 10 is positioned under the cabin 5 and is provided in the inside of the vehicle body 2. The engine 10 is configured by, for example, a large-sized diesel engine. As shown in FIG. 2, the engine 10 is connected mechanically to a main power generator 12. The engine 10 drives the main power generator 12 to generate three-phase AC power (for example, approximately 1500 kW). In addition to this, the engine 10 drives an auxiliary power generator 13 for DC. The auxiliary power generator 13 is connected to a battery 14 as a power source of a controller 19 to charge the battery 14. The engine 10 is provided with a rotational sensor 11. The rotational sensor 11 detects an engine rotational speed W. (rotational speed) and outputs the detection result to the controller 19.

In addition, the engine 10 drives and rotates a hydraulic pump (not shown) as a power source, and has also a function of delivering pressurized oil to, for example, the hoist cylinder 4 and a steering cylinder for power steering (not shown) or discharging the pressurized oil therefrom.

Figure 3:
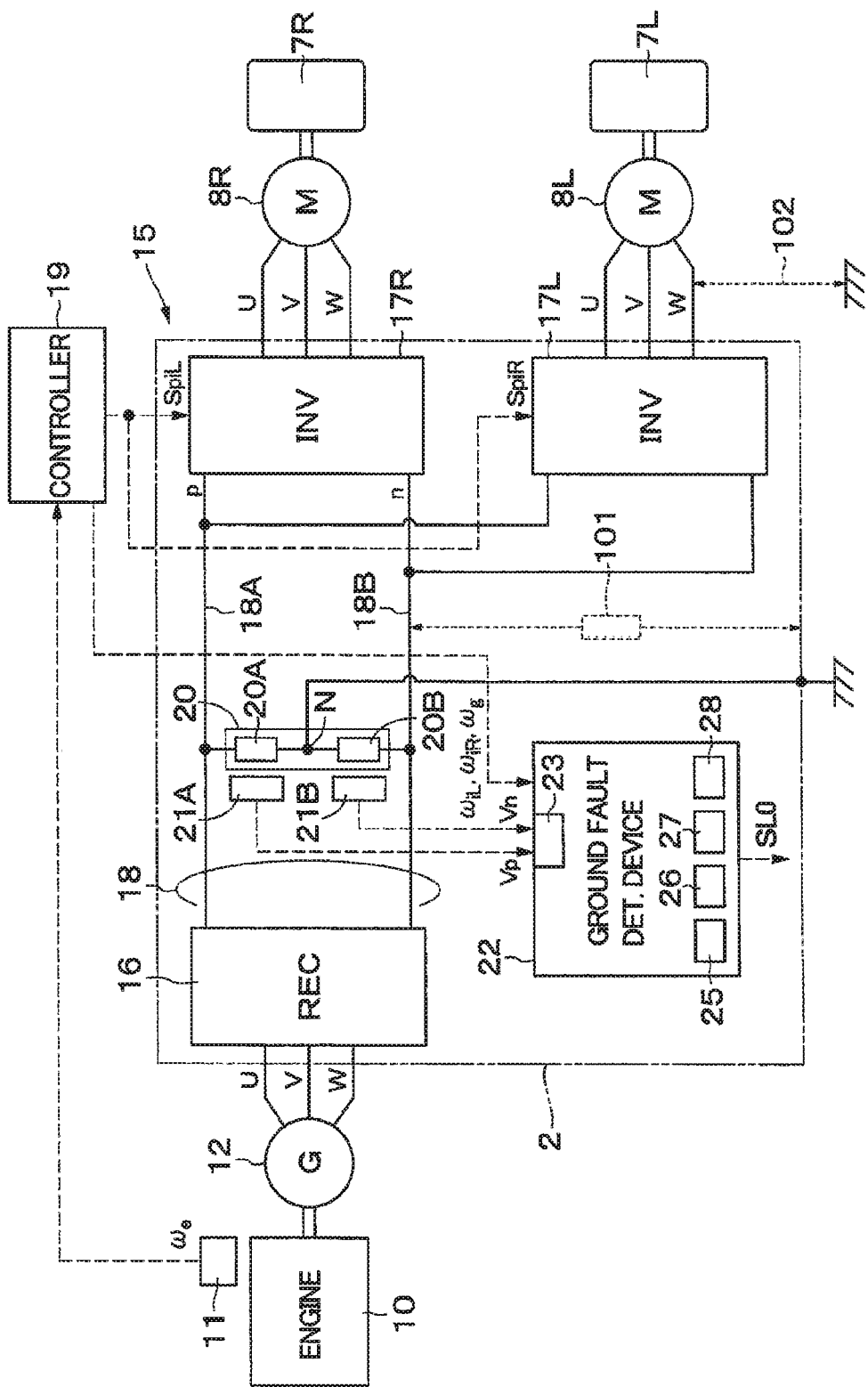
FIG. 3 is an electrical circuit diagram showing the dump truck in FIG. 1.

The power control device 15 performs power control of the dump truck 1 together with the controller 19. The power control device 15 is positioned in a lateral side to the cabin 5 and is configured by a power distribution control panel provided to rise upward on the deck part 2A of the vehicle body 2. As shown in FIG. 3, the power control device 15 is provided with a rectifier 16, the inverters 17R, 17L and a DC bus 18.

The rectifier 16 configures a converter of converting AC into DC. The rectifier 16 is configured using, for example, a rectifying cell such as a diode or a thyristor and the like to full-wave rectify AC power. The rectifier 16 is connected to an output side of the main power generator 12 and converts three-phase AC power outputted from the main power generator 12 into DC power. Therefore, the rectifier 16 configures a DC power source together with the main power generator 12. The rectifier 16 is connected to the inverters 17R, 17L through the DC bus 18. It should be noted that a smoothing capacitor may be connected to an output side (DC bus 18-side) of the rectifier 16. Further, the AC is converted into the DC using, for example, a voltage-source converter, not limited to the rectifier 16.

The inverters 17R, 17L are configured by a plurality of switching devices (not shown) such as transistors, thyristors, insulating gate bipolar transistors (IGBT). The inverters 17R, 17L are connected to the DC bus 18. The inverters 17R, 17L convert DC power into three-phase AC power of a variable drive frequency at the traveling of the dump truck 1. Therefore, the inverters 17R, 17L switch "ON" and "OFF" of the switching device with a carrier frequency Fc higher in frequency than the drive frequency, and control the pulse width in accordance with the drive frequency. Consequently, the inverters 17R, 17L convert the DC power outputted from the rectifier 16 into the three-phase AC power, and supply the three-phase AC power to the traveling motors 8R, 8L. It should be noted that the carrier frequency Fc is set to a value of approximately 1 to 2 kHz, for example.

The DC bus 18 has a positive electrode line 18A (positive electrode p) and a negative electrode line 18B (negative electrode n), and, for example, a DC high voltage of 1000 V to 4000 V is applied to the DC bus 18. Specifically, the AC voltage outputted from the main power generator 12 is converted into the DC voltage by the rectifier 16, which is applied between the positive electrode line 18A and the negative electrode line 18B. In addition, the DC bus 18 establishes electrical connection between the rectifier 16 and the inverters 17R, 17L. Consequently, the power generated by the main power generator 12 is supplied to the traveling motors 8R, 8L through the rectifier 16, the DC bus 18 and the inverters 17R, 17L.

The controller 19 is configured by a microcomputer. The controller 19 configures a travel control device that controls a travel of the dump truck 1. The controller 19 is connected to the power control device 15, and controls/switches the switching devices of the inverters 17R, 17L in accordance with a traveling state of the dump truck 1. At the traveling of the dump truck 1, the controller 19 controls/switches the switching devices of the inverters 17R, 17L to convert the DC power from the main power generator 12 into the three-phase AC power.

Specifically, the controller 19 controls/switches the switching devices of the inverters 17R, 17L in such a manner that the traveling motors 8R, 8L drive by an output torque in response to an accelerator operation of an operator, for example. At this time, the controller 19 outputs PWM signals SpiR, SpiL to the inverters 17R, 17L to switch on or off the switching devices of the inverters 17R, 17L at the carrier frequency Fc. Consequently, the inverters 17R, 17L generate three-phase AC current a pulse width of which is controlled in response to the PWM signals SpiR, SpiL to drive the traveling motors 8R, 8L with a desired torque.

In addition, the controller 19 receives a detection signal in accordance with an engine rotational speed $\omega_e$ from the engine rotational sensor 11. At this time, the controller 19 controls a power generation voltage of the main power generator 12 connected to the engine 10 based upon the engine rotational speed $\omega_e$.

Further, the controller 19 outputs signals in accordance with driving angular frequencies $\omega_{iR}$, $\omega_{iL}$ (acquired by multiplying the drive frequency by $2\pi$) of the inverters 17R, 17L as a base for producing the PWM signals SpiR, SpiL to the ground fault detection device 22. At this time, the driving angular frequencies $\omega_{iR}$, $\omega_{iL}$ are an angular frequency of a fundamental wave of the three-phase AC current/voltage generated by the inverters 17R, 17L. In addition to this, the controller 19 calculates an output angular frequency $\omega_g$ (acquired by multiplying output frequency by $2\pi$) of the main power generator 12 in accordance with an engine rotational speed $\omega_e$ and outputs a signal in accordance with the output angular frequency $\omega_g$. At this time, the output angular frequency $\omega_g$ is an angular frequency of a fundamental wave of the three-phase AC current/voltage generated by the main power generator 12.

A voltage divider 20 is connected to the positive electrode line 18A and the negative electrode line 18B of the DC bus 18, and divides the voltage applied to the DC bus 18 to form a neutral point N. The voltage divider 20 is provided with voltage dividing resistors 20A, 20B. The voltage dividing resistors 20A, 20B are serially connected between the positive electrode line 18A and the negative electrode line 18B. At this time, the voltage dividing resistors 20A, 20B are formed by high resistances of several tens kΩ several MΩ, for example. The voltage dividing resistors 20A, 20B each are set to the same resistance value. As a result, the voltage divider 20 divides a high voltage to be applied between the positive electrode line 18A and the negative electrode line 18B of the DC bus 18 into two voltages absolute values of which are equal. At this time, the neutral point N is connected to the vehicle body 2 as the ground.

A voltage sensor 21A detects a voltage (detection voltage Vp) between the positive electrode line 18A and the neutral point N. The voltage sensor 21A outputs a signal in accordance with the detection voltage Vp. A voltage sensor 21B detects a voltage (detection voltage Vn) between the neutral point N and the negative electrode line 18B. The voltage sensor 21B outputs a signal in accordance with the detection voltage Vn. These voltage sensors 21A, 21B are connected to a ground fault detection device 22.

Figure 4:
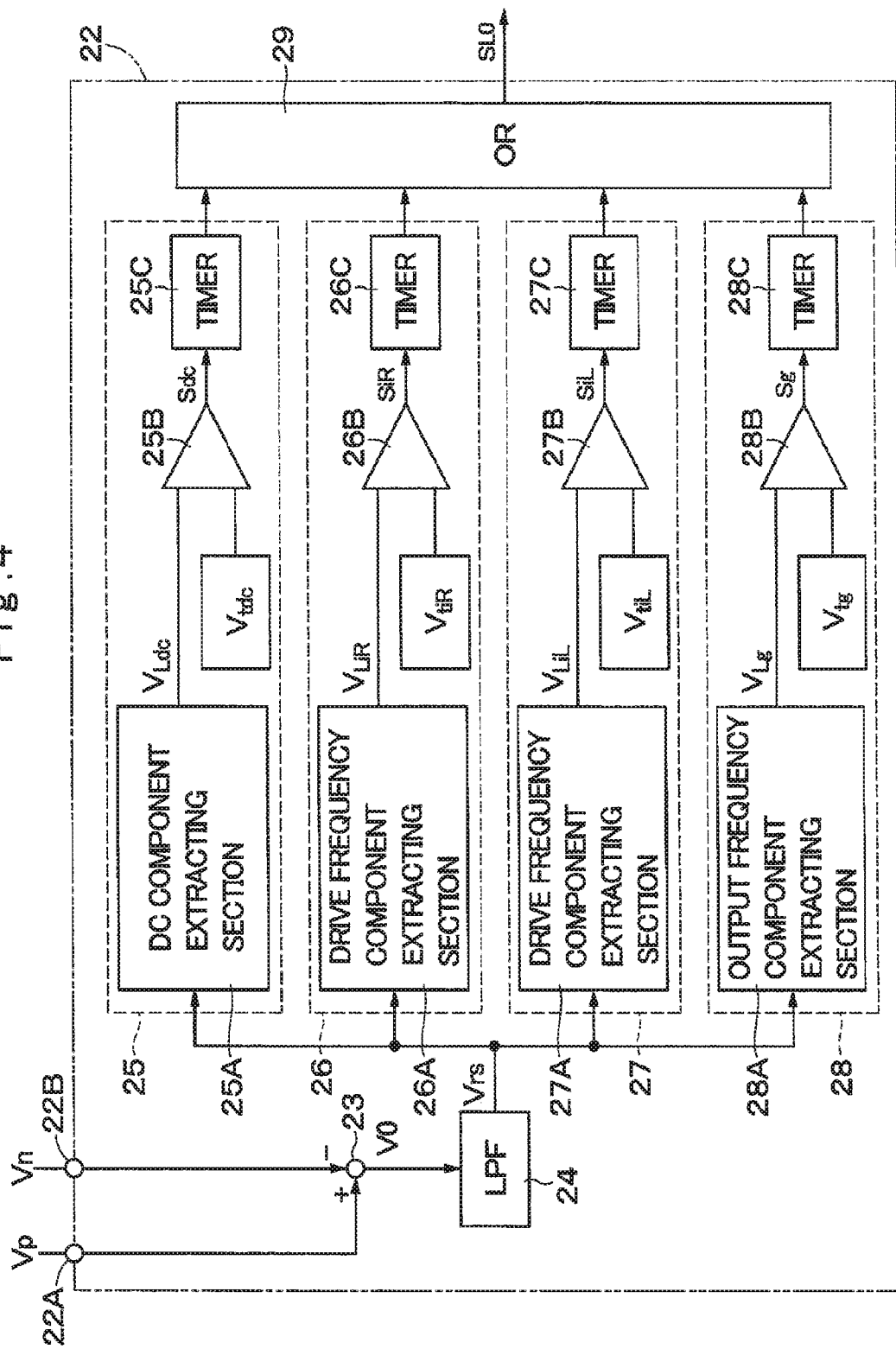
FIG. 4 is a block diagram showing a ground fault detection device in FIG. 3.

The ground fault detection device 22 is configured by a microcomputer that executes various kinds of calculation processes. The ground fault detection device 22 detects a ground fault detection voltage V0 composed of a difference between the detection voltage Vp between the positive electrode line 18A and the neutral point N and the detection voltage Vn between the neutral point N and the negative electrode line 18B. The ground fault detection device 22 detects the ground fault both between DC and ground and between AC and ground based upon the ground fault detection voltage V0. Therefore, the ground fault detection device 22 has input terminals 22A, 22B to which signals of the detection voltages Vp, Vn from the voltage sensors 21A, 21B are inputted, and is provided with an adder 23 as a ground fault detection voltage calculating section that calculates the ground fault detection voltage V0 from the detection voltages Vp, Vn. As shown in FIG. 4, the adder 23 calculates a difference (difference voltage) between the signal of the detection voltage Vp and the signal of the detection voltage Vn as the ground fault detection voltage V0. The difference voltage (ground fault detection voltage V0) is inputted to a low-pass filter 24 (LPF 24) for noise filtering-out and becomes a signal Vrs acquired by filtering out a high frequency component approximately equal to or more than a carrier frequency Fc of the inverters 17R, 17L.

The ground fault detection device 22 is provided with a DC component determining section 25 that extracts a DC component $V_{Ldc}$ from the signal Vrs in accordance with the ground fault detection voltage V0 and determines the ground fault based upon the DC component $V_{Ldc}$. The DC component determining section 25 is provided with a DC component extracting section 25A that extracts the DC component $V_{Ldc}$ from the ground fault detection voltage V0, and a DC component comparing section 25B that compares the DC component $V_{Ldc}$ with a predetermined criteria value $V_{Ldc}$ for DC ground fault detection.

The DC component extracting section 25A calculates an average value of ground fault detection voltages V0 (signals Vrs) over a predetermined specified time. Consequently, the DC component extracting section 25A outputs an average value of the signals Vrs as the DC components $V_{Ldc}$. At this time, the specified time is set to a value longer than one cycle of the carrier frequency Fc, for example. In addition to this, the specified time is a value longer than one cycle of the drive frequency of each of the inverters 17R, 17L at the low-speed traveling, for example, and a value without being affected by a third harmonic at the low-speed traveling. Specifically, for example when the maximum drive frequency is assumed to be 40 Hz, assuming that the consideration to the extent of the frequency that is one-tenth of the maximum drive frequency is only required as the low-speed traveling, the consideration to the extent of 4 Hz is only required. At this time, for example, when time integration that is ten times as long as the cycle is assumed to be performed for filtering out the affection of the 12 Hz as the frequency of the third harmonic, the time amounts to approximately one second. Accordingly, a lower limit value of the specified time is approximately one second. However, when the specified time is too long, the detection of the DC component $V_{Ldc}$ is delayed. Therefore, the specified time is set to a short time within an allowable range of an error of the DC component $V_{Ldc}$. Specifically, an upper limit value of the specified time is determined in consideration of the affection to a human body by the ground fault. In this case, in a time region exceeding one second, the affection to the human body is approximately constant without any change in response to time. In consideration of these, the specified time is set to an appropriate time equal to or more than approximately one second, for example, approximately 0.8 to 1.2 seconds. It should be noted that the specified time is not limited to the aforementioned value, but may be set as needed according to a specification of a vehicle or the like.

The DC component comparing section 25B compares the DC component $V_{Ldc}$ with the DC ground fault detection criteria value $V_{tdc}$, and sets a ground fault detection signal Sdc to "1 (true)" when the DC component $V_{Ldc}$ is larger than the DC ground fault detection criteria value $V_{Ldc}$. On the other hand, the DC component comparing section 25B compares the DC component $V_{Ldc}$ with the DC ground fault detection criteria value $V_{tdc}$, and sets the ground fault detection signal Sdc to "0 (false)" when the DC component $V_{Ldc}$ is smaller than the DC ground fault detection criteria value $V_{tdc}$. At this time, the DC ground fault detection criteria value $V_{tdc}$ is appropriately set in consideration of an amplitude or affection of the ground fault current by the DC component $V_{Ldc}$. The ground fault detection signal Sdc outputted from the DC component comparing section 25B is inputted into a logical OR block 29 through a timer 25C for preventing a malfunction due to noise.

The ground fault detection device 22 is provided with drive frequency component determining sections 26, 27 that extract drive frequency components $V_{LiR}$, $V_{LiL}$ of the inverters 17R, 17L from a signal Vrs in accordance with the ground fault detection voltage V0 and determine the ground fault based upon the drive frequency components $V_{LiR}$, $V_{LiL}$.

The drive frequency component determining section 26 is provided with a drive frequency component extracting section 26A that extracts the drive frequency component $V_{LiR}$ of the inverter 17R from the ground fault detection voltage V0, and a drive frequency component comparing section 26B that compares the drive frequency component $V_{LiR}$ with a predetermined criteria value $V_{tiR}$ for AC ground fault detection.

The drive frequency component extracting section 26A acquires the driving angular frequency $\omega_{iR}$ of the inverter 17R based upon a signal from the controller 19. The drive frequency component extracting section 26A performs integral calculation on the value which the ground fault detection voltage V0 multiplied by a fundamental wave of the driving angular frequency $\omega_{iR}$ of the inverter 17R to find a fundamental wave component of the driving angular frequency $\omega_{iR}$ of the inverter 17R from the ground fault detection voltage V0. At this time, the integration period is set to a value equal to the integral multiple of the cycle of the driving angular frequency $\omega_{iR}$. As a result, the drive frequency component extracting section 26A outputs the fundamental wave component of the driving angular frequency $\omega_{iR}$ of the inverter 17R as the drive frequency component $V_{LiR}$. Specifically, the drive frequency component extracting section 26A finds the fundamental wave component of the driving angular frequency $\omega_{iR}$ of the inverter 17R as the drive frequency component $V_{LiR}$ based upon an expression of Fourier Transform as shown in the following Formula 1.

$$V_{LiR}=\sqrt{(\int(Vrs\cdot\sin\omega_{iR}t)dt)^2+(\int(Vrs\cdot\cos)_{iR}t)dt)^2} \quad \text{[Formula 1]}$$

The drive frequency component comparing section 26B sets a ground fault detection signal SiR to "1 (true)" when the drive frequency component $V_{LiR}$ is larger than the AC ground fault detection criteria value $V_{tiR}$. On the other hand, the drive frequency component comparing section 26B sets the ground fault detection signal SiR to "0 (false)" when the drive frequency component $V_{LiR}$ is smaller than the AC ground fault detection criteria value $V_{tiR}$. At this time, the AC ground fault detection criteria value $V_{tiR}$ is appropriately set in consideration of an amplitude or affection of the ground fault current by the drive frequency component $V_{LiR}$. The ground fault detection signal SiR outputted from the drive frequency component comparing section 26B is inputted into the logical OR block 29 through a timer 26C for preventing a malfunction due to noise.

A drive frequency component determining section 27 is configured as substantially similar to the drive frequency component determining section 26. Therefore, the drive frequency component determining section 27 is provided with a drive frequency component extracting section 27A, a drive frequency component comparing section 27B and a timer 27C that are substantially similar to the drive frequency component extracting section 26A, the drive frequency component comparing section 26B and the timer 26C. At this time, the drive frequency component extracting section 27A finds the fundamental wave component of the driving angular frequency $\omega_{iL}$ of the inverter 17L as the drive frequency component $V_{LiL}$, based upon an expression of Fourier Transform as shown in the following Formula 2 as substantially similar to that of Formula 1. At this time, the integration period is set to the integral multiple of the cycle of the driving angular frequency $\omega_{iL}$.

$$V_{LiL}=\sqrt{(\int(Vrs \cdot \sin\omega_{iL}t)dt)^2+(\int(Vrs \cdot \cos)_{iL}t)dt)^2} \qquad \text{[Formula 2]}$$

The drive frequency component comparing section 27B sets a ground fault detection signal SiL to "1 (true)" when the drive frequency component $V_{LiL}$ is larger than the AC ground fault detection criteria value $V_{tiL}$. On the other hand, the drive frequency component comparing section 27B sets the ground fault detection signal SiL to "0 (false)" when the drive frequency component $V_{LiL}$ is smaller than the AC ground fault detection criteria value $V_{tiL}$. At this time, the AC ground fault detection criteria value $V_{tiL}$ is appropriately set in consideration of an amplitude or affection of the ground fault current by the drive frequency component $V_{LiL}$. The ground fault detection signal SiL outputted from the drive frequency component comparing section 27B is inputted into the logical OR block 29 through the timer 27C for preventing a malfunction due to noise.

Further, the ground fault detection device 22 is provided with an output frequency component determining section 28 that extracts an output frequency component $V_{Lg}$ of the main power generator 12 from a signal Vrs in accordance with the ground fault detection voltage V0 and determines the ground fault based upon the output frequency component $V_{Lg}$.

The output frequency component determining section 28 is provided with an output frequency component extracting section 28A that extracts the output frequency component $V_{Lg}$ of the main power generator 12 from the ground fault detection voltage V0, and an output frequency component comparing section 28B that compares the output frequency component $V_{Lg}$ with a predetermined criteria value $V_{tg}$ for AC ground fault detection.

The output frequency component extracting section 28A acquires an output angular frequency $\omega_g$ of the main power generator 12 based upon a signal from the controller 19. The output frequency component extracting section 28A performs integral calculation on the value which the ground fault detection voltage V0 multiplied by a fundamental wave of the output angular frequency $\omega_g$ of the main power generator 12 to find a fundamental wave component of the output angular frequency $\omega_g$ of the main power generator 12 from the ground fault detection voltage V0. At this time, the integration period is set to a value equal to the integral multiple of the cycle of the output angular frequency $\omega_g$. As a result, the output frequency component extracting section 28A outputs the fundamental wave component of the output angular frequency $\omega_g$ of the main power generator 12 as the output frequency component $V_{Lg}$. Specifically, the output frequency component extracting section 28A finds the fundamental wave component of the output angular frequency $\omega_g$ of the main power generator 12 as the output frequency component $V_{Lg}$ based upon an formula of Fourier Transform as shown in the following Formula 3.

$$V_{Lg}=\sqrt{(\int(Vrs \cdot \sin\omega_g t)dt)^2+(\int(Vrs \cdot \cos\omega_g t)dt)^2} \qquad \text{[Formula 3]}$$

The output frequency component comparing section 28B sets a ground fault detection signal Sg to "1 (true)" when the output frequency component $V_{Lg}$ is larger than the criteria value $V_{tg}$ for AC ground fault detection. On the other hand, the output frequency component comparing section 28B sets the ground fault detection signal Sg to "0 (false)" when the output frequency component $V_{Lg}$ is smaller than the criteria value $V_{tg}$ for AC ground fault detection. At this time, the criteria value $V_{tg}$ for AC ground fault detection is appropriately set in consideration of an amplitude or affection of the ground fault current by the output frequency component $V_{Lg}$. It should be noted that the criteria values $V_{tiR}$, $V_{tiL}$, $V_{tg}$ for AC ground fault detection and the criteria value $V_{tdc}$ for DC ground fault detection may be the same value or different values with each other.

The ground fault detection signal Sg outputted from the output frequency component comparing section 28B is inputted into the logical OR block 29 through a timer 28C for preventing a malfunction due to noise. It should be noted that the timers 25C, 26C, 27C, 28C function as low-pass filters for filtering out a high-frequency noise, for example. At this time, cutoff frequencies of the timers 25C, 26C, 27C, 28C may be the same value or different values with each other.

The logical OR block 29 calculates a logical OR of the ground fault detection signals Sdc, SiR, SiL, Sg. The logical OR block 29 outputs the calculation result of the logical OR as a final ground fault detection signal SL0. When the final ground fault detection signal SL0 is "0 (false)", the ground fault detection device 22 does not detect the ground fault. On the other hand, when the final ground fault detection signal SL0 is "1 (true)", the ground fault detection device 22 detects the ground fault of DC or AC side circuit of the drive system.

It should be noted that an output side of the logical OR block 29 may be provided with a timer identical to the timers 25C, 26C, 27C or 28C to prevent the malfunction due to noise. That is, the timers may be provided in both of the input side and the output side of the logical OR block 29, or the time may be provided in either side thereof.

The dump truck 1 according to the present embodiment has the configuration as described above, and next, an operation thereof will be explained with reference to FIG. 1 to FIG. 6.

First, when an operator who gets in the cabin 5 in the dump truck 1 activates the engine 10 as shown in FIG. 3, the power generation is performed by the main power generator 12 and the auxiliary power generator 13. The power generated in the auxiliary power generator 13 is supplied to the controller 19 through the battery 14. The power generated in the main power generator 12 is supplied to the traveling motors 8R, 8L through the power control device 15. At the acceleration of the dump truck 1, the controller 19 controls the inverters 17R, 17L, and converts the DC power from the main power generator 12 into the three-phase AC power, which will be supplied to the traveling motors 8R, 8L.

In addition, the ground fault detection device 22 is mounted on the dump truck 1. The ground fault detection device 22 detects the ground fault of the DC and/or AC side circuit of the drive system by an operation as follows.

For example, in the electrical circuit for driving the traveling motors 8R, 8L, there is assumed a case where the electric potential between the positive electrode line 18A and the negative electrode line 18B of the DC bus 18 is 2200 V, and each of resistance values of the voltage dividing resistors 20A, 20B is 30 kΩ. Based thereupon, as shown in FIG. 3, a case where the negative electrode line 18B of the DC bus 18 is ground-faulted in 3.3 kΩ as a ground fault resistor 101 of an insulating degrading portion will be considered.

In this case, since a resistance value between the positive electrode line 18A of the DC bus 18 and a housing ground potential (electric potential of the vehicle body 2) is a parallel resistance value to 30 kΩ of the voltage dividing resistor 20A and 3.3 kΩ of the ground fault resistor 101, the resistance value becomes 3 kΩ. Accordingly, 2200 V as the DC voltage of the DC bus 18 is distributed to the voltage between the positive electrode line 18A of the DC bus 18 and the neutral point N and to the voltage between the neutral point N and the negative electrode line 18B of the DC bus 18 according to a ratio of 30 kΩ and 3 kΩ. That is, since 2200 V is distributed to 2000 V and 200 V, a DC unbalanced voltage of 1800 V is generated therebetween. Therefore, the ground fault detection device 22 detects the DC unbalanced voltage based upon the ground fault detection voltage V0, making it possible to determine that the ground fault generates.

In addition, there will be considered a case where when, for example, an AC output side of each of the inverters 17R, 17L is a phase voltage output of 300 Vr.m.s., a ground fault portion 102 is ground-faulted in 0Ω. This case shows that the phase voltage output of 300 Vr.m.s. is short-circuited in a parallel resistance (30 kΩ/2=15 kΩ) to the voltage dividing resistor 20A in the positive electrode side and the voltage dividing resistor 20B in the negative electrode side, and the ground fault current (300 V/15 kΩ=20 mA) flows. One-second of this current flows in such a manner as to be divided in a direction of the voltage dividing resistor 20A in the positive electrode side and in the reverse direction of the voltage dividing resistor 20B in the negative electrode side. As a result, the AC unbalanced voltage of 30 kΩ×(20 mA/2)×2=600 V generates. Therefore, the ground fault detection device 22 detects the DC unbalanced voltage based upon the ground fault detection voltage V0, making it possible to determine that the ground fault generates.

Figure 5:
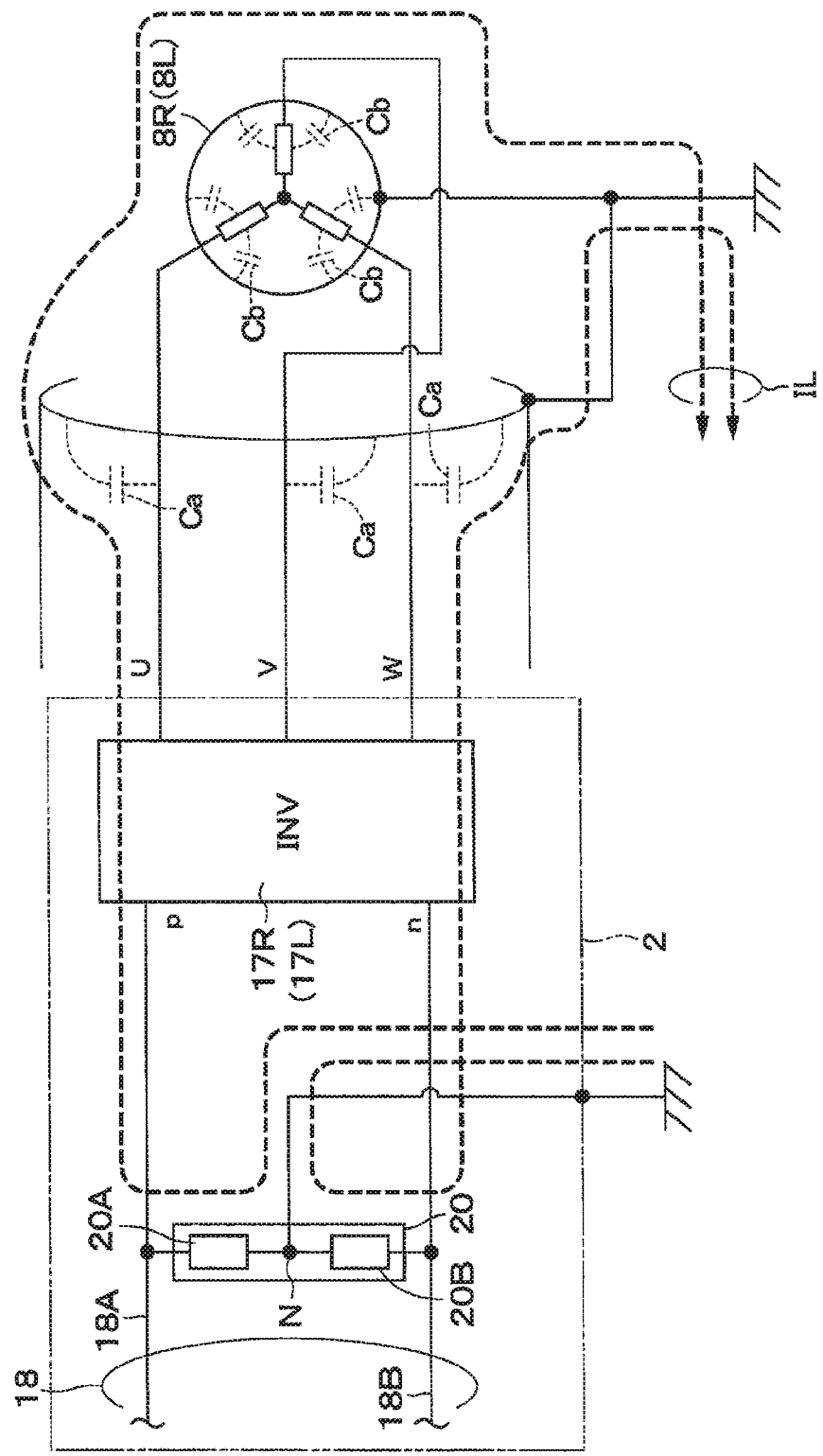
FIG. 5 is an explanatory diagram showing a ground fault current of AC.

Incidentally, as shown in FIG. 5, stray capacitances Ca, Cb exist between a main circuit conductor and a ground potential in the traveling motors 8R, 8L to be driven by the inverters 17R, 17L. Therefore, when the AC voltage of each of the traveling motors 8R, 8L by the inverters 17R, 17L is applied, leak current IL of the drive frequency components $V_{LiR}$, $V_{LiL}$ of the inverters 17R, 17L flows through the stray capacitances Ca, Cb and the voltage dividing resistors 20A, 20B of the voltage divider 20. In a case where each voltage of the neutral point N and the AC output has a three-phase sine wave, a sum of instantaneous values of AC voltages applied to the respective phases (U phase, V phase, W phase) amounts to 0 V. Therefore, a sum of instantaneous values of the leak current IL of the respective phases also amounts to 0 mA, and the ground fault detection voltage V0 does not appear by the leak current IL.

However, for increasing the maximum AC voltage in the inverters 17R, 17L, it is general to perform "third harmonic superposition" of adding harmonic components of the integral multiple of 3 to the modulating wave of the PWM control. In this case, by adding third harmonic components V3u, V3v, V3w as injection third harmonics to the fundamental wave component of each phase in accordance with the drive frequency, the third harmonic superposed voltage of each phase (each phase third harmonic superposition). In addition to this, the traveling motors 8R, 8L of the dump truck 1 change in rotational speed from a stop region to a high rotational region at the high speed traveling. At this time, in a low-speed rotational region, the inverters 17R, 17L drive in a sine wave voltage. On the other hand, in the high-speed region, the inverters 17R, 17L drive out of the sine wave voltage by reduction of the pulse number per cycle of the drive frequency. As a result, in the high-speed rotational region, the output voltage of each of the inverters 17R, 17L contains many harmonic voltage components like the third harmonic (refer to FIG. 6).

Particularly, the voltage to be applied to the DC bus becomes a high voltage equal to or more than 1000 V in the inverter control in a large capacitance and a large variable speed range of a dump truck, railway or the like. Therefore, a power loss due to a switching operation of the switching device in the inverter tends to easily increase. For reducing such a power loss, there is a tendency of setting the carrier frequency of the inverter to be lower. As a result, in the high-speed region where a vehicle speed is increased, a single pulse mode where the output power is modulated by one pulse of the PWM signal is possibly generated. At this time, the output voltage of the inverter is largely out of the sine wave to contain many high harmonics. Therefore, since an average ground voltage (approximately equal to a neutral point voltage) of a motor winding wire contains many frequency components that are three times the drive frequency of the inverter, this voltage is applied to the stray capacitances between motor windings and ground, possibly generating a large leak current.

Figure 6:
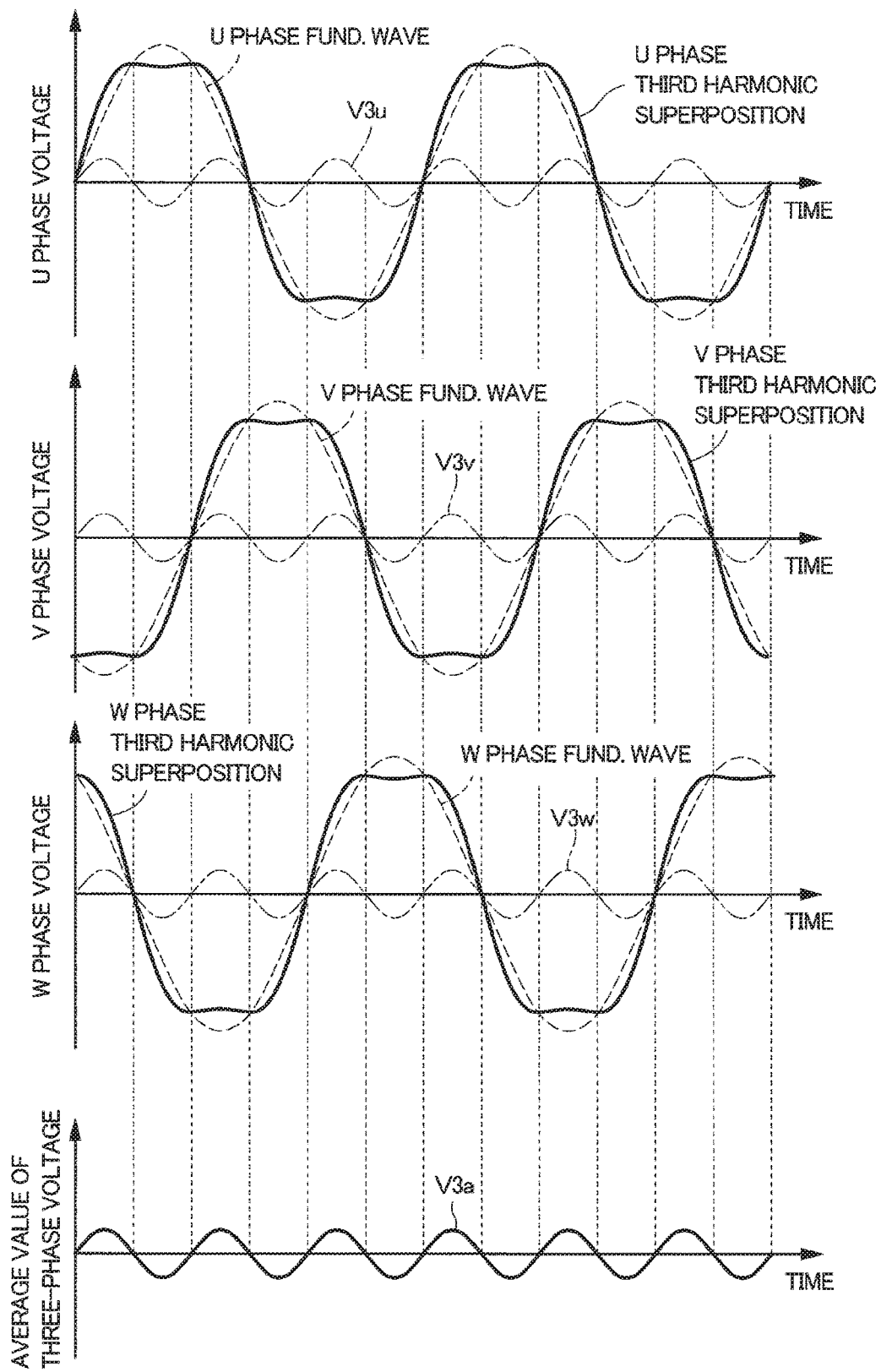
FIG. 6 is an explanatory diagram showing a change in voltage of each phase of an inverter over time and a change in an average value of voltages in the three phases.

As shown in FIG. 6, instantaneous values of harmonic components that are the integral multiple of 3 of the fundamental wave (third harmonic components V3u, V3v, V3w) appear as the same phase components of the respective phases (U phase, V phase, W phase) in the three-phase voltage. Therefore, an average value V3a of the three-phase voltages amounts to a sum of the voltage instantaneous values of the third harmonic components V3u, V3v, V3w. However, the third harmonic components V3u, V3v, V3w cannot be cancelled out in the average value V3a. As a result, the leak current IL equal to the components that are the integral multiple of 3 of the drive frequency of the inverters 17R, 17L flows through the stray capacitances Ca, Cb of the traveling motors 8R, 8L and the voltage divider 20, and the ground fault detection voltage V0 appears by this leak current IL.

In the ground fault detection device described in Patent document 2, the ground fault detection voltage is generated by this component, leading to the malfunction of the ground fault detection. Further, Patent Document 2 discloses, as the conventional technology, the configuration in which a low-pass filter is applied to the ground fault detection device. However, also in this configuration, the malfunction of the ground fault detection is unavoidable due to the third harmonic component in a variable speed inverter drive circuit wide in a speed control range that is applied to a dump truck, based upon the reason as follows.

For example, in a case where the drive frequency of the inverter is in a range of from 0 Hz to 30 Hz, a cutoff frequency of the low-pass filter is required to be equal to or more than 30 Hz. However, the frequency of the third harmonic in a case of operating in a basic frequency of 8 Hz within the operating range is 24 Hz, and it is not possible to filter out the ground fault detection signal by the third harmonic with the low-pass filter having the cutoff frequency of 30 Hz or more. That is, in a case where the cutoff frequency of the low-pass filter is made lower than 24 Hz, the drive frequency component of the inverter cannot be detected in the high-speed region such as 30 Hz, making it impossible to detect the ground fault state. On the other hand, in a case where the cutoff frequency of the low-pass filter is made higher than 30 Hz, it is not possible to sufficiently filter out components of the leak current due to the third harmonic flowing in the stray capacitance in the low-speed region such as 8 Hz, posing a problem with an erroneous detection in the ground fault detection.

On the other hand, the ground fault detection device 22 according to the present embodiment is provided with the DC component determining section 25 and the drive frequency component determining sections 26, 27. Therefore, the DC component determining section 25 can determine whether or not the ground fault is generated based upon the DC component $V_{Ldc}$ of the ground fault detection voltage V0, and the drive frequency component determining sections 26, 27 can determine whether or not the ground fault is generated based upon the drive frequency component $V_{LiR}$, $V_{LiL}$ of the inverters 17R, 17L.

That is, the ground fault detection device 22 selectively detects only the DC component $V_{Ldc}$ of the current flowing in the ground resistor and the drive frequency components $V_{LiR}$, $V_{LiL}$ of the inverters 17R, 17L, and does not respond to the frequency component that is three times the drive frequency of each of the inverters 17R, 17L. Therefore, the ground fault detection device 22 does not erroneously detect the ground fault state even in the low speed and can detect the ground fault state even in the high speed.

It should be noted that in the electrically operated working vehicle such as the dump truck 1, there is no assumption that a person comes in contact with the live parts of the main circuits during the traveling. For example, when the harmonic is contained in the output waveform of each of the inverters 17R, 17L in the high-speed region, there are some cases where a large leak current IL is generated through the stray capacitances Ca, Cb. Even in this case, when the main circuit including the traveling motors 8R, 8L is stopped or in a sine wave output speed region of a low speed, the average ground potential of the motor winding wire amounts to approximately zero. Therefore, generation of the large leak current IL due to the event that the stray capacitances between motor windings and ground (stray capacitances Ca, Cb) of the main circuit is large does not bring any risk to a maintenance person. Accordingly, the ground fault detection by detecting the frequency component that is three times the drive frequency of each of the inverters 17R, 17L may be treated as the erroneous detection.

In addition, in the present embodiment, the DC component determining section 25 is provided with the DC component extracting section 25A that extracts the DC component $V_{Ldc}$ from the ground fault detection voltage V0, and the DC component comparing section 25B that compares the DC component $V_{Ldc}$ with the predetermined criteria value $V_{tdc}$ for DC ground fault detection. At this time, the DC component extracting section 25A extracts the DC component $V_{Ldc}$ from the ground fault detection voltage V0.

Therefore, the DC component comparing section 25B compares the extracted DC component $V_{Ldc}$ with the DC ground fault detection criteria value $V_{tdc}$, thereby making it possible to determine whether or not the ground fault is generated in the DC circuit including the DC bus 18.

In addition, the DC component extracting section 25A calculates an average value of the ground fault detection voltages V0 over the predetermined specified time. Therefore, by setting the specified time to an appropriate average calculation period, the DC component extracting section 25A functions as the low-pass filter in which the cutoff frequency is very low. As a result, the average value of the ground fault detection voltages V0 can be extracted as the DC component $V_{Ldc}$ from the ground fault detection voltages V0, and the ground fault of the AC part generated in portions other than the DC circuit is not detected.

On the other hand, the drive frequency component determining sections 26, 27 are provided with the drive frequency component extracting sections 26A, 27A that extract the drive frequency components $V_{LiR}$, $V_{LiL}$ of the inverters 17R, 17L from the ground fault detection voltage V0, and the drive frequency component comparing sections 26B, 27B that compare the drive frequency components $V_{LiR}$, $V_{LiL}$ with the predetermined criteria values $V_{tiR}$, $V_{tiL}$ for AC ground fault detection. At this time, the drive frequency component extracting sections 26A, 27A extract the drive frequency components $V_{LiR}$, $V_{LiL}$ from the ground fault detection voltage V0. Therefore, the drive frequency component comparing sections 26B, 27B compare the extracted drive frequency components $V_{LiR}$, $V_{LiL}$ with the AC ground fault detection criteria values $V_{tiR}$, $V_{tiL}$, thereby making it possible to determine whether or not the ground fault is generated in the AC circuit including the inverters 17R, 17L.

In addition, the drive frequency component extracting sections 26A, 27A perform integral calculation on the value which the ground fault detection voltage V0 multiplied by the fundamental wave of the drive angle frequencies $\omega_{iR}$, $\omega_{iL}$ of the inverters 17R, 17L to find the drive frequency components $V_{LiR}$, $V_{LiL}$ composed of the fundamental wave components of the drive angle frequencies $\omega_{iR}$, $\omega_{iL}$ of the inverters 17R, 17L from the ground fault detection voltage V0. At this time, the drive frequency component extracting sections 26A, 27A find the fundamental wave components of the drive angle frequencies $\omega_{iR}$, $\omega_{iL}$ of the inverters 17R, 17L using an formula of Fourier Transform. Consequently, the drive frequency component determining sections 26, 27 selectively detect only the ground fault of the AC circuit including the inverters 17R, 17L and do not erroneously detect the ground fault in the other frequency component. Accordingly, it is possible to prevent the ground fault from being erroneously detected in the leak current flowing through the stray capacitance of the AC circuit.

Further, the main power generator 12 (power generator) is connected to the DC bus 18 through the rectifier 16 (converter) that converts AC into DC, and the ground fault detection device 22 is provided with the output frequency component determining section 28 that extracts the output frequency component $V_{Lg}$ of the main power generator 12 from the ground fault detection voltage V0 and determines the ground fault based upon the output frequency component $V_{Lg}$. Therefore, the output frequency component determining section 28 can determine whether or not the ground fault is generated in the AC circuit including the main power generator 12 based upon the output frequency components $V_{Lg}$ of the main power generator 12.

In addition, the output frequency component determining section 28 is provided with the output frequency component extracting section 28A that extracts the output frequency component $V_{Lg}$ of the main power generator 12 from the ground fault detection voltage V0, and the output frequency component comparing section 28B that compares the output frequency component $V_{Lg}$ with the predetermined criteria value $V_{tg}$ for AC ground fault detection. At this time, the output frequency component extracting section 28A extracts the output frequency component $V_{Lg}$ from the ground fault detection voltage V0. Therefore, the output frequency component comparing section 28B compares the extracted output frequency component $V_{Lg}$ with the AC ground fault detection criteria value $V_{Lg}$, thereby making it possible to determine whether or not the ground fault is generated in the AC circuit including the main power generator 12.

In addition, the output frequency component extracting section 28A performs integral calculation on the value which the ground fault detection voltage V0 multiplied by the fundamental wave of the output angular frequency $\omega_g$ of the main power generator 12 to find the output frequency component $V_{Lg}$ composed of the fundamental wave component of the output angular frequency $\omega_g$ of the main power generator 12 from the ground fault detection voltage V0. At this time, the output frequency component extracting section 28A finds the fundamental wave component of the output angular frequency $\omega_g$ of the main power generator 12 using the formula of Fourier Transform. Consequently, the output frequency component extracting section 28A selectively detects only the ground fault of the AC circuit including the main power generator 12 and does not erroneously detect the ground fault in the other frequency component. Accordingly, it is possible to prevent the ground fault from being erroneously detected in the leak current flowing through the stray capacitance of the AC circuit.

In addition, the ground fault detection signals Sdc, SiR, SiL, Sg to be inputted to the logical OR block 29 each selectively detect the ground fault of the DC circuit, the AC circuit of the inverter 17R, the AC circuit of the inverter 17L or the AC circuit of the main power generator 12. Therefore, when the ground fault is detected by the ground fault detection device 22, it is possible to specify which component in the dump truck 1 the ground fault is generated in by checking the ground fault detection signals Sdc, SiR, SiL, Sg.

In the aforementioned embodiment, the DC component extracting section 25A is configured to calculate the average value of the ground fault detection voltage V0. The present invention is not limited thereto, but a DC component extracting section may be configured by a low-pass filter in which a cutoff frequency is set to be very low.

In the aforementioned embodiment, the drive frequency component extracting section extracts the drive frequency component using the formula of Fourier Transform. The present invention is not limited thereto, but a drive frequency component extracting section may be configured by a filter a pass frequency band of which is narrow and can be variably set depending upon a drive frequency of an inverter, such as a peak filter. Likewise, an output frequency component extracting section may be configured by a filter having a narrow pass frequency bandwhich can be variably set depending upon a drive frequency of an inverter.

Figure 7:
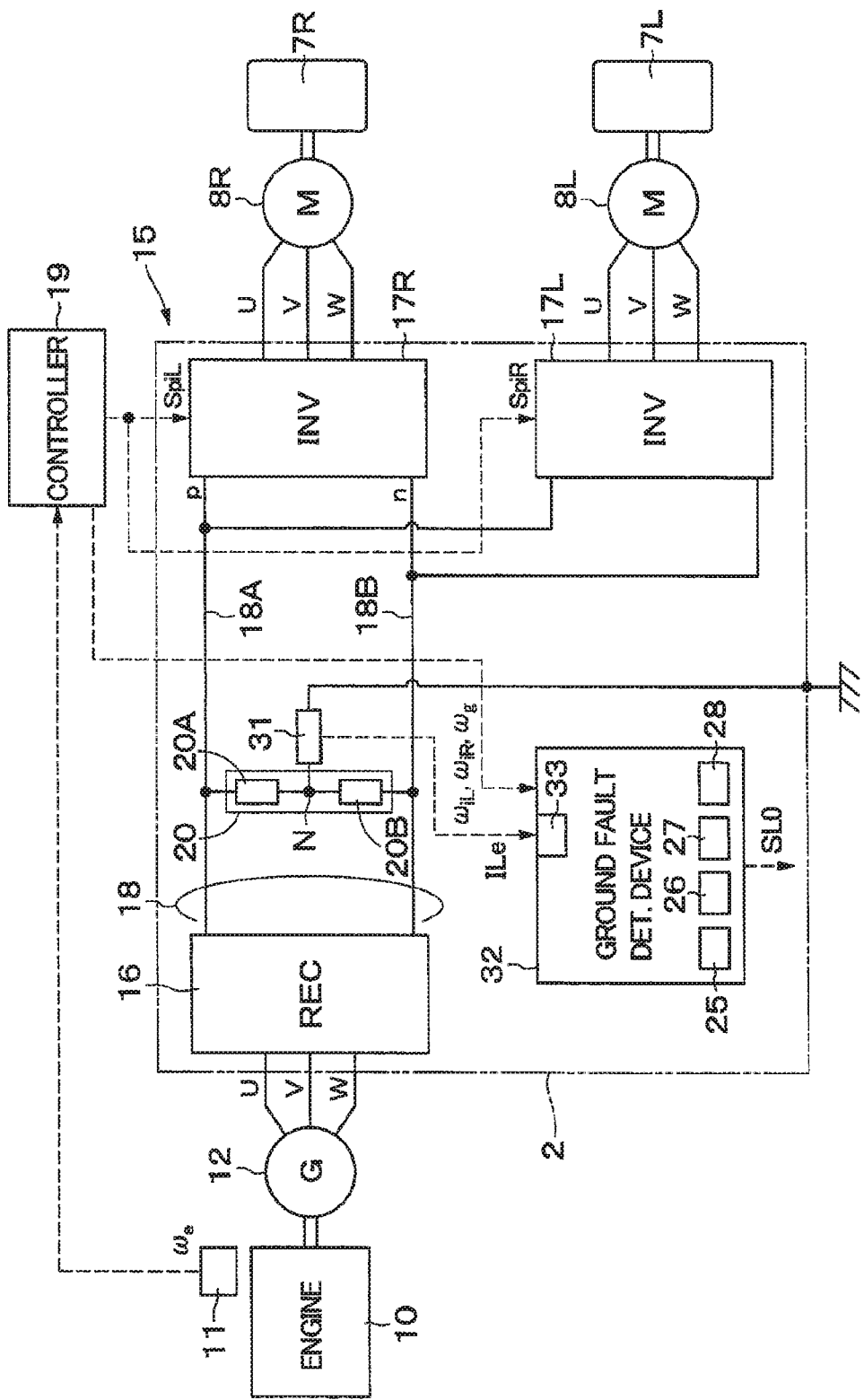
FIG. 7 is an electrical circuit diagram as similar to that in FIG. 3, showing a dump truck to which a ground fault detection device according to a modification is applied.

In the aforementioned embodiment, the ground fault detection device 22 is provided with the adder 23 that directly calculates the difference between the detection voltage Vp between the positive electrode line 18A and the neutral point N and the detection voltage Vn between the neutral point N and the negative electrode line 18B, as the ground fault detection voltage calculating section that detects the ground fault detection voltage V0. The present invention is not limited thereto, but may detect the ground fault detection voltage V0 based upon current ILe flowing from the neutral point N to the ground. The current ILe in accordance with a difference between a voltage between the positive electrode line 18A and the neutral point N and a voltage between the neutral point N and the negative electrode line 18B flows from the neutral point N to the ground (vehicle body 2). Therefore, as shown in a modification in FIG. 7, the current ILe flowing from the neutral point N to the ground is detected by a current sensor 31. Based thereupon, a ground fault detection device 32 may be provided with a current-voltage conversion section 33 that converts the current ILe into the ground fault detection voltage V0, as a ground fault detection voltage calculating section.

Further, the aforementioned embodiment is explained by exemplifying the dump truck 1 of a rear-wheel drive type as the electrically operated working vehicle. However, the present invention is not limited thereto, but may be applied to a front-wheel drive dump truck or a four-wheel drive dump truck driving both of front and rear wheels, and a working vehicle other than a dump truck.

DESCRIPTION OF REFERENCE NUMERALS

1: Dump truck
2: Vehicle body
6R, 6L: Front wheel
7R, 7L: Rear wheel
8R, 8L: Traveling motor (Electric motor)
10: Engine
12: Main power generator (Power generator)
13: Auxiliary power generator
16: Rectifier
17R, 17L: Inverter
18: DC bus
18A: Positive electrode line
18B: Negative electrode line
19: Controller
20: Voltage divider
20A, 20B: Voltage dividing resistor
21A, 21B: Voltage sensor
22, 32: Ground fault detection device
23: Adder (Ground fault detection voltage calculating section)
25: DC component determining section
25A: DC component extracting section
25B: DC Component comparing section
26, 27: Drive frequency component determining section
26A, 27A: Drive frequency component extracting section
26B, 27B: Drive frequency component comparing section
28: Output frequency component determining section
28A: Output frequency component extracting section
28B: Output frequency component comparing section
29: Logical OR block
31: Current sensor
33: Current-voltage conversion section (Ground fault detection voltage calculating section)

The invention claimed is:
1. An electrically operated working vehicle, comprising:
a DC bus that is composed of a positive electrode and a negative electrode and to which a DC voltage is applied;
an inverter that is connected to the DC bus;
an electric motor that is connected to the inverter;

a voltage divider that is connected to the positive electrode and the negative electrode of the DC bus and divides a voltage applied to the DC bus to form a neutral point; and a ground fault detection device that detects a ground fault detection voltage as a difference between a voltage between the positive electrode of the DC bus and the neutral point and a voltage between the neutral point and the negative electrode of the DC bus and detects a ground fault based upon the ground fault detection voltage, wherein the ground fault detection device includes:
   a DC component determining section that extracts a DC component from the ground fault detection voltage and determines a ground fault based upon the DC component; and
   a drive frequency component determining section that extracts a drive frequency component of the inverter from the ground fault detection voltage and determines a ground fault based upon the drive frequency component, wherein the DC component determining section includes a DC component extracting section that extracts a DC component from the ground fault detection voltage, and a DC component comparing section that compares the DC component with a predetermined criteria value for DC ground fault detection, and wherein the drive frequency component determining section includes a drive frequency component extracting section that extracts a drive frequency component of the inverter from the ground fault detection voltage, and a drive frequency component comparing section that compares the drive frequency component with a predetermined criteria value for AC ground fault detection.

2. The electrically operated working vehicle according to claim 1, wherein
   the DC component extracting section calculates an average value of the ground fault detection voltage over a predetermine specified time.

3. The electrically operated working vehicle according to claim 1, wherein
   the drive frequency component extracting section performs integral calculation on the value which the ground fault detection voltage multiplied by a fundamental wave of a driving angular frequency of the inverter to find a fundamental wave component of the driving angular frequency of the inverter from the ground fault detection voltage.

4. The electrically operated working vehicle according to claim 1, wherein
   a power generator is connected to the DC bus through a converter that converts AC into DC, and
   the ground fault detection device further includes an output frequency component determining section that extracts an output frequency component of the power generator from the ground fault detection voltage and determines a ground fault based upon the output frequency component.

5. The electrically operated working vehicle according to claim 4, wherein
   the output frequency component determining section includes an output frequency component extracting section that extracts an output frequency component of the power generator from the ground fault detection voltage, and an output frequency component comparing section that compares the output frequency component with a predetermined criteria value for AC ground fault detection.

6. The electrically operated working vehicle according to claim 5, wherein
   the output frequency component extracting section performs integral calculation on the value which the ground fault detection voltage multiplied by a fundamental wave of the output angular frequency of the power generator to find a fundamental wave component of the output angular frequency of the power generator from the ground fault detection voltage.

\* \* \* \* \*